United States Patent [19]

Naarmann et al.

[11] Patent Number: 4,464,511

[45] Date of Patent: Aug. 7, 1984

[54] POLYMERS WHICH HAVE TWO OR MORE STABLE, REVERSIBLY INTERCONVERTIBLE OXIDATION STATES, THEIR PREPARATION AND THEIR USE

[75] Inventors: Herbert Naarmann, Wattenheim; Klaus Penzien, Frankenthal; Volker Muench; Klaus-Dieter Franz, both of Ludwigshafen, all of Fed. Rep. of Germany

[73] Assignee: BASF Aktiengesellschaft, Fed. Rep. of Germany

[21] Appl. No.: 394,184

[22] Filed: Jul. 1, 1982

[30] Foreign Application Priority Data

Jul. 3, 1981 [DE] Fed. Rep. of Germany ....... 3126264

[51] Int. Cl.³ .............................. C08F 8/23; C08F 8/30
[52] U.S. Cl. ..................................... 525/61; 525/327.4; 525/327.5; 525/327.6; 525/328.2; 525/328.5; 525/328.8; 525/331.5; 525/343; 525/352; 525/360; 525/379; 525/380; 525/382; 525/384; 525/385
[58] Field of Search .................... 525/61, 327.4, 327.5, 525/327.6, 328.2, 328.5, 328.8, 331.5, 343, 352, 360, 379, 380, 382, 384, 385

[56] References Cited

FOREIGN PATENT DOCUMENTS 1388417 3/1975 United Kingdom .

OTHER PUBLICATIONS

F. B. Kaufmann, A. H. Schroeder, E. M. Engler, V. V. Patel: "Applied Physical Letters" 36, (6), (1980), pp. 422–425.
T. Murata "Topics in Non–Benzoid Aromatic Systems", vol. 1, (1976), p. 159ff.
K. D. Franz "Journal of Organic Chemistry", vol. 44, No. 10, (1979), pp. 1704–1708.
K. D. Franz & R. L. Martin, "Tetrahedron", vol. 34 (1978), pp. 2147–2151.
IBM Technical Disclosure Bulletin, vol. 22, Nr. 5, Oct. 1979, pp. 2116–2118.
Australian Jouranl of Chemistry, vol. 28, Nr. 11, Nov. 1975, pp. 2343–2351.

*Primary Examiner*—Joseph L. Schofer
*Assistant Examiner*—Bernard Lipman
*Attorney, Agent, or Firm*—Keil & Weinkauf

[57] ABSTRACT

Polymers which have two or more stable, reversibly interconvertible oxidation states with half-wave potentials $E_{\frac{1}{2}}$ of from $-1.5$ to $+1$ V, and which are obtained when a polymer having a reactive side group is reacted with a 1,9-substituted phenalene, are useful for producing electrically conductive systems, in the electrical industry, and for converting and fixing radiation, for producing electric switches, as electrochromic displays, for providing an antistatic finish on plastics and as reversible redox systems.

4 Claims, No Drawings

POLYMERS WHICH HAVE TWO OR MORE STABLE, REVERSIBLY INTERCONVERTIBLE OXIDATION STATES, THEIR PREPARATION AND THEIR USE

The present invention relates to polymers which have two or more stable, reversibly interconvertible oxidation states with half-wave potentials $E_{\frac{1}{2}}$ of from $-1.5$ to $+1$ V, and which are obtained when a polymer having a reactive side group is reacted with a compound from the class comprising the 1,9-substituted phenalenes. Accordingly, the novel polymers contain, as side groups, 1,9-disubstituted phenalene radicals linked to the main polymer chain via the 9-position.

It has been disclosed that polymers containing reactive side groups may be converted to derivatized polymers with novel, desirable properties. Thus, polyvinylamine reacts with pyridine-2-carbaldehyde to give a novel polymeric chelating agent for $Cu^{2\oplus}$ (cf. E. Bayer, K. Geckler and K. Weingärtner, Makromol. Chem. 181 (1980), 585), or polyvinylbenzyl chloride may be derivatized using tetrathiafulvalene and thereby converted into an electrochromic polymer which exhibits color changes when a voltage is applied (cf. F. B. Kaufmann, A. H. Schroeder, E. M. Engler and V. V. Patel, Appl. Phys. Letters 36 (6) (1980), 422).

Moreover, it has been disclosed that the alternating $C_{13}$-hydrocarbon phenalene

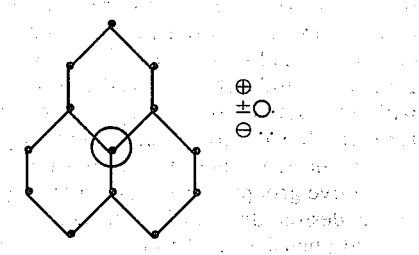

can occur in 3 oxidation states (cf. I. Murata, "Topics in Non-Benzoid Aromatic Systems", vol. I (1976), 159). When this $\pi$-system is "disturbed" by 1,9-substitution, the system retains its ability to exhibit a plurality of oxidation states (cf. K. D. Franz, J. Org. Chem. 44 (1979), 1704 and K. D. Franz and R. L. Martin, Tetrahedron 34 (1978), 2147). Thus, phenalenes exhibit the following half-wave potentials ($E_{\frac{1}{2}}$): 9-hydroxyphenalen-1-one, $E_{\frac{1}{2}} = -0.95$ V, 9-methoxyphenalen-1-one, $E_{\frac{1}{2}} = 1.11$ V, 9-(N-methylamino)-phenalen-1-one, $E_{\frac{1}{2}} = -1.27$ V, 1-ethoxy-9-benzylthiophenalenium tetrafluorborate, $E_{\frac{1}{2}} = +0.1$ V; $E_{\frac{1}{2}} = -0.97$ V, 1-(N-methylamino)-9-dimethylamino-phenalenium tetrafluoroborate, $E_{\frac{1}{2}} = -0.43$ V; $E_{\frac{1}{2}} = -1.3$ V.

The half-wave potential is defined in the standard textbooks on electrochemistry (cf. for example, "Organic Electrochemistry", M. N. Baizer, M. Dekker Publishers, New York, 1973).

Moreover, it has been disclosed that the substituted phenalenes have a very intense color, and may be used as dyes (cf. British Pat. No. 1,388,417).

Conventional electrochromic systems, for example polyvinylbenzyl chloride coupled to tetrathiafulvalene, have the disadvantage that the active groups absorb relatively weakly in the visible range, so that the desired effect is not very pronounced. It is necessary to compensate for this, when this system or other systems are used, by increasing the thickness of the polymer layer and/or using larger amounts of TTF, with the result that the electrical resistance is increased, and therefore the response times are increased and the sensitivity reduced.

It is an object of the present invention to provide novel polymers which are simple to prepare, have two or more stable, reversibly interconvertible oxidation states with half-wave potentials $E_{\frac{1}{2}}$ of from $-1.5$ to $+1.0$ V. It is a further object to provide polymers of this type which exhibit strong absorption in the visible range. By virtue of their properties, the novel polymers are intended to exhibit a very good, generally improved, usefulness and a wide range of uses in the electrical industry and in chemistry.

We have found that these objects are achieved by the polymers according to the invention and the process for their preparation.

Accordingly, the present invention relates to polymers which are capable of forming two or more stable, reversibly interconvertible oxidation states with half-wave potentials $E_{\frac{1}{2}}$ of from $-1.5$ to $+1$ V, and contain, as side groups, 1,9-disubstituted phenalene radicals which are linked via the 9-position to the main polymer chain.

The novel polymers are obtained when a polymer having a reactive group is reacted with a 1,9-disubstituted phenalene, in general in a solvent, at from 50° to 150° C. The particular half-wave potential desired can be established by oxidizing or reducing the polymer prepared according to the invention.

1,9-Disubstituted phenalenes which are particularly suitable for the reaction with the polymer having the reactive group are those of the general formua (I) or (II)

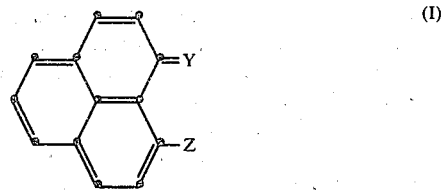

(I)

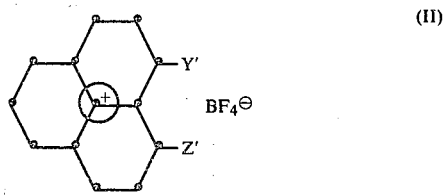

(II)

where Y is O, NR, S, Se or Te, Z is OR, SR, NR₂, —O—(CH₂)ₘ—OR, —NH—(CH₂)ₘ—OR, —S—(CH₂)ₘ—OR, —NH—(CH₂)ₘ—NR₂, —O—(CH₂)ₘ—NR₂, —S—(CH₂)ₘ—NR₂, —O—(CH₂)ₘ—CHO or —N₂MeF₆ where Me is As or Sb, and Y' is —OR, —SR or —NR₂, Z' is —OR, —SR or —NR₂, and R is H, C₁–C₅-alkyl, C₆–C₁₂-cycloalkyl or C₇–C₁₄-aralkyl, and, in the group —NR₂, the two radicals R may also be cyclically linked to one another, and m is 1–5.

In the formulae (I) and (II), Y is preferably O, NR or S, in particular O, Z is preferably OR, NR₂, SR, —O—(CH₂)ₘ—OR, —NH—(CH₂)ₘ—OR, —O—(CH₂)ₘ—NR₂, —NH—(CH₂)ₘ—NR₂ or —O—(CH₂)ₘ—CHO, Y' is preferably OR or NR₂, Z' is preferably OR or NR₂, and R is preferably H or C₁–C₅-alkyl, eg. methyl, ethyl or butyl. When Z is SR, R is in particular C₁–C₅-alkyl; when Z is —NH—(CH₂)$_m$—OR, —NH—(CH₂)$_m$—NR₂, —O—(CH₂)$_m$—OR or —O—(CH₂)$_m$—NR₂, R is in particular H; when Z is NR₂, the radicals R may be, in particular, both H or both C₁–C₅-alkyl, or one of them may be H and the other C₁–C₅-alkyl. When Y′ or Z′ is OR, R is in particular C₁–C₅-alkyl; when Y′ or Z′ is NR₂, the radicals R, in particular, are both C₁–C₅-alkyl, or are linked to one another via an alkylene bridge, or one of them is H and the other C₁–C₅-alkyl.

Examples of suitable 1,9-substituted phenalenes are 9-n-butoxyphenalen-1-one, 9-N-methylaminophenalen-1-one, 9-aminophenalen-1-one, 9-butylthiophenalen-1-one, 9-mercaptophenalen-1-one, 9-mercaptothiophenalen-1-one, 9-hydroxythiophenalen-1-one, 9-aminothiophenalen-1-one, 9-N-butylaminothiophenalen-1-one, 9-n-butoxythiophenalen-1-one, 9-aminoiminophenalen-1-one, 1-ethoxy-9-benzylthiophenalenium tetrafluorborate, 1-ethoxy-9-butoxyphenalenium tetrafluorborate, 1-ethoxy-9-ethoxyphenalenium tetrafluorborate, 9-isopropylamino-1-ethoxyphenalenium tetrafluorborate, 9-dimethylamino-1-ethylaminophenalenium tetrafluorborate, 9-methylamino-1-methylaminophenalenium tetrafluorborate, 9-butoxy-1-pyrrolidinophenalenium tetrafluorborate, phenalen-1-one-9-diazonium hexafluoroantimonate, 1-thiophenalenone-9-diazonium hexafluoroantimonate, 9-butoxy-1-alkyliminophenalenone, 9-butoxy-1-butylthiophenalenium tetrafluorborate, 9-butylthio-1-ethoxyphenalenium tetrafluorborate, 9-(pentylenoxy-5′-aldehyde)-phenalen-1-one, 9-N-(4′-hydroxy-n-butylene)-aminophenalen-1-one and 9-N-(4′-amino-n-butylene)-aminophenalen-1-one). The preparation of these 1,9-disubstituted phenalenes employed according to the invention is described in J. Org. Chem. 44 (1979), 1704, in Tetrahedron 34 (1978), 2147, and in British Pat. No 1,388,417.

Polymers which have reactive side groups and which are suitable for the reaction with the 1,9-disubstituted phenalenes are, in particular, those which contain repeating units of the general formula (III), (IV) or (V)

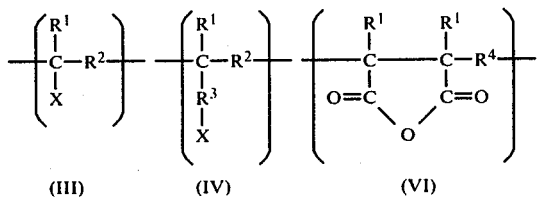

(III)   (IV)   (VI)

where X is OH, SH, NH₂, —COOR¹, —O—C(O)—R⁵, COCl or halogen, R¹ is H, C₁–C₅-alkyl or aryl, R² is C₁–C₅-alkylene, C₁–C₅-alkylidene or arylene, R³ is C₁–C₅-alkylene, C₁–C₅-alkylidene, 1,4-cycloalkylene or p-arylene, R⁴ is —[CH(C₆H₅)—CH₂]—, and R⁵ is C₁–C₅-alkyl.

Where X is halogen, this is in particular Cl or Br. R¹ is, for example, methyl, ethyl, propyl, butyl or phenyl. R² may be, for example, CH₂, C₂H₄, C₃H₆, C₄H₈ or an unsubstituted or substituted phenylene radical. R³ is, for example, CH₂, C₂H₄, C₃H₆, C₄H₈, C₆H₁₀ or an unsubstituted or substituted phenylene radical, eg. C₆H₄ or

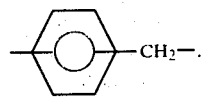

R⁵ is, for example, methyl, ethyl, propyl or butyl. Preferably, R¹ is H, CH₃— or C₂H₅—, R² is —CH₂— or —CH(CH₃)—, R³ is —CH₂—, —C₂H₄—,

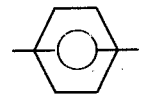

or

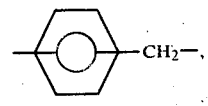

R⁵ is CH₃, and X is OH, NH₂, COOR¹, —O—C(O)—R⁵, COCl or Cl. Where X is COOR¹, R¹ is preferably H, CH₃, C₂H₅ or C₄H₉.

The polymers having reactive side groups may be those which comprise only repeating units of the general formula (III), (IV) or (V), containing in general from 5 to 10,000, preferably from 50 to 5,000, of these units. They may also equally be copolymers which contain, in addition to the units, for example, of the general formula (III) or (IV), further comonomers without reactive groups, eg. ethylene, propylene, styrene, etc. In such copolymers, the ratio of the different comonomeric building blocks and thus the proportion of reactive groups in the copolymers depend, inter alia, on the desired degree of modification by the 1,9-disubstituted phenalenes. The molecular weight of the polymers having reactive side groups can vary within wide limits, and is preferably from 500 to 1,000,000, in particular from 5,000 to 500,000 (weight average).

Examples of suitable polymers containing repeating units of the general formula (III) or (IV) are polyvinyl chloride, polyvinyl alcohol, partially hydrolyzed polyvinyl acetate, polyvinyl acetate, polyvinylamine, poly-(1-aminoprop-2-ene), poly-(1-hydroxyprop-2-ene), polymethyl crotonate, polymethyl vinylacetate, polyvinylacetic acid chloride, poly-p-aminostyrene, poly-(p-amino-alpha-methylstyrene), poly-p-chloromethylstyrene, polyacrylic acid, polyethyl acrylate, polyacrylic acid chloride, polymethacrylic acid, polymethyl methcarylate and polyethyl methacrylate.

Examples of suitable polymers of the general formula (III) are copolymers of styrene and fumaric anhydride and/or maleic anhydride. Particularly suitable polymers are polyvinylamine, poly-p-aminostyrene, polyvinyl alcohol, partially hydrolyzed polyvinyl acetate, polyvinyl acetate and copolymers of styrene and maleic anhydride, poly-p-aminostyrene being preferred.

To prepare the novel polymers, the polymer having the reactive side group is usually dissolved in a suitable solvent at 50°–150° C., and the 1,9-disubstituted phenalene, dissolved in the same solvent, is added dropwise to the hot solution. After from 1 to 30 hours, the resulting product is precipitated by the addition of a suitable liquid in which the novel polymer is insoluble, and is isolated. If necessary, the novel polymer thus isolated may be dissolved again and reprecipitated as described above. This reprecipitation may be repeated several times.

Suitable solvents for the preparation of the novel polymers are ethanol, methanol, trichloromethane, dichloromethane, 1,2-dichloroethane, dimethylformamide (DMF), N-methylpyrrolidone, perchlorobutadiene, dibutyl ether and tetrahydrofuran (THF). DMF, perchlorobutadiene, 1,2-dichloromethane and THF are particularly suitable, THF being preferred. Examples of suitable liquids in which the polymers are insoluble are acetonitrile, n-hexane and n-heptane.

When a polymer having a reactive side group is reacted with a 1,9-disubstituted phenalene, the polymeric organic substance obtained carries 1,9-disubstituted phenalene as a side group linked via the 9-position of the phenalene radical to the main polymer chain. The novel polymers are capable of forming two or more stable, reversibly interconvertible oxidation states.

To change the oxidation state, the novel polymer is oxidized or reduced, preferably electrochemically, for example by applying it, as a 1–1,000 μm thick film, by spin-coating to an electrode, and subjecting it to the electrochemical oxidation or reduction in this form.

A summary of selected reactions according to the invention is given below. Particularly preferred polymers according to the invention are obtained when poly-p-aminostyrene is reacted with 9-butoxyphenalen-1-one or with 9-butoxy-1-ethoxyphenalenium tetrafluorborate. The reaction of poly-[p-N-(9'-phenalen-1'-one)-aminostyrene] with triethyloxonium tetrafluorborate is given as an example of the change in the oxidation state of the novel polymer, and therefore in its half-wave potential.

The novel polymers are useful for producing electrically conductive systems in the electrical industry, and for converting and fixing radiation, for producing electric switches, as electrochromic displays, for providing an antistatic finish on plastics and as reversible redox systems.

Summary of the reactions

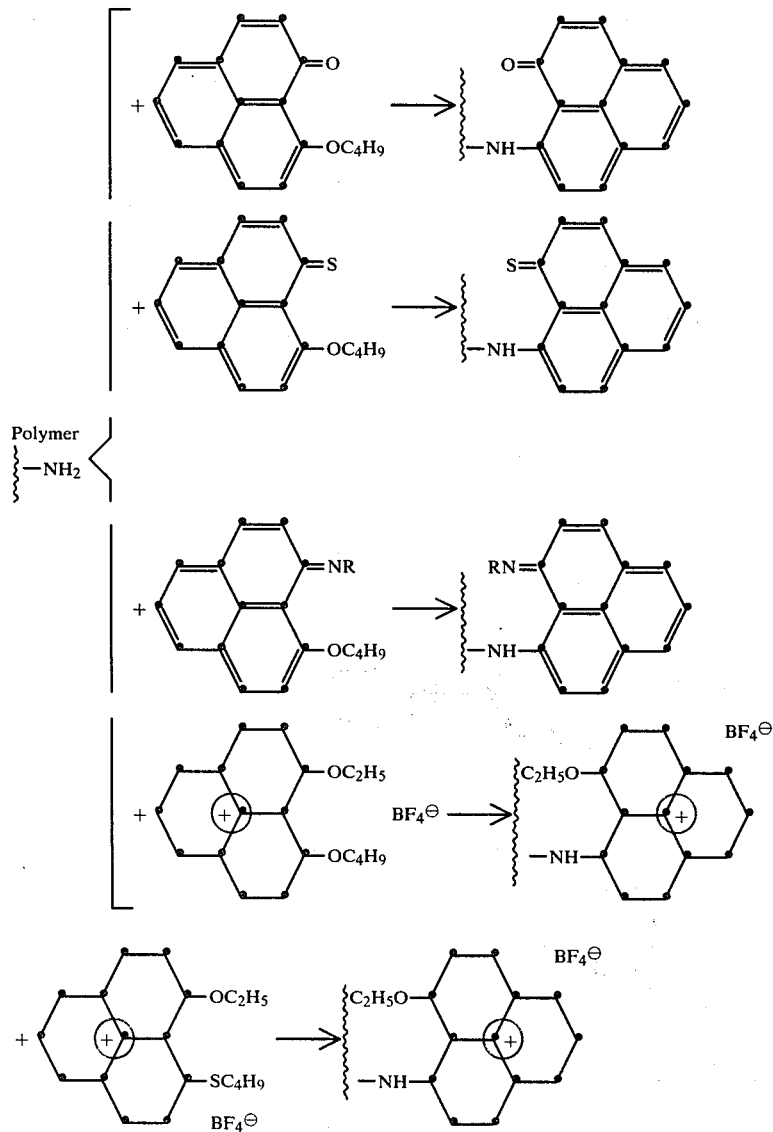

-continued
Summary of the reactions
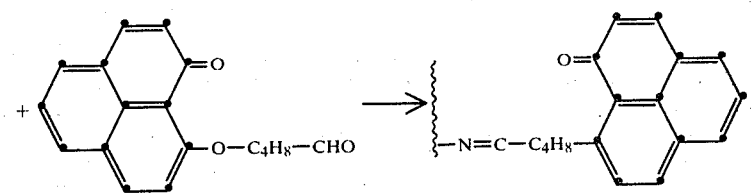
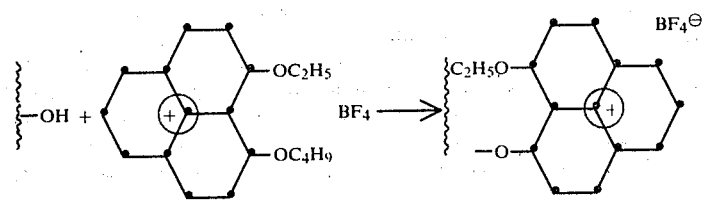
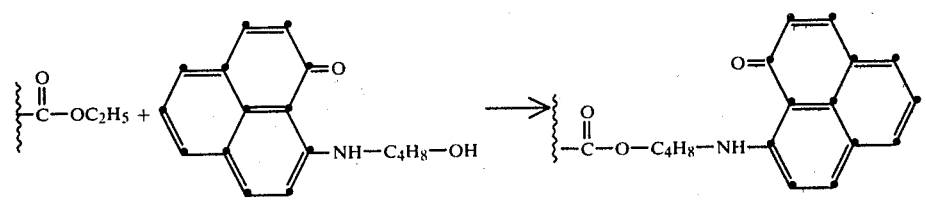
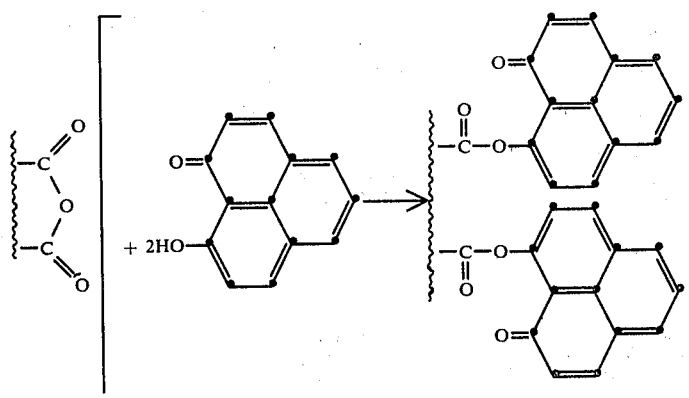
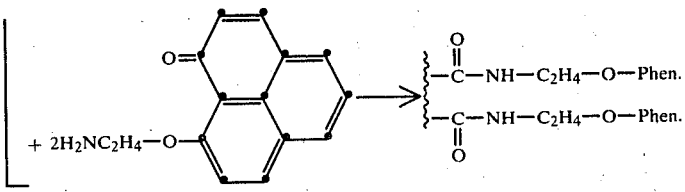
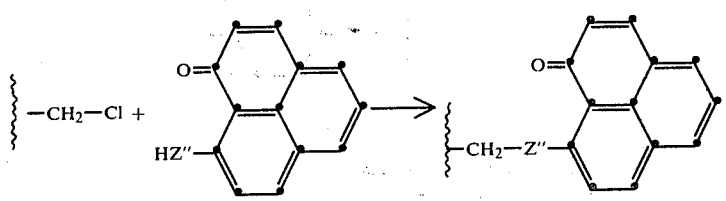
(Z" = —O—, —S—, —NR—)

-continued
Summary of the reactions

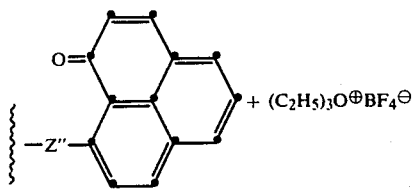

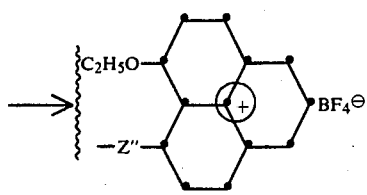

(Z" = —O—, —S—, —NR—)

EXAMPLE 1

1 mole (119 g) of poly-p-aminostyrene was dissolved in 1,500 ml of tetrahydrofuran (THF), and the solution was heated to 65° C. 1 mole (252 g) of 9-butoxyphenalen-1-one was dissolved in 250 ml of THF, and the solution was added dropwise to the hot polymer solution in the course of 30 minutes, while stirring. The mixture was allowed to continue reacting for 10 hours at 65° C., and the polymer was then precipitated by dropwise addition of 1,000 ml of n-hexane. The precipitated product was filtered off under suction and was reprecipitated twice with THF/n-hexane. Yield of poly-[p-N-(9'-phenalen-1'-one)-aminostyrene]: 279 g, degree of derivatization: about 90%, based on poly-p-aminostyrene. Formula:

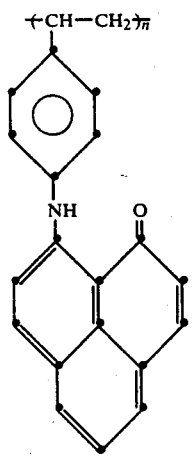

REDOX BEHAVIOR, EXAMPLE 1

The product of the reaction of 9-butoxyphenalen-1-one with poly-p-aminostyrene, obtained as described in Example 1, was dissolved in tetrahydrofuran, and the solution was applied by spin-coating to platinum-coated silicon chips to give a 1–1,000 μm thick layer. Such a coated chip was immersed in a bath of acetonitrile in which tri-n-butylammonium perchlorate had been dissolved, as a conductive salt. The redox behavior of the coating was then measured by cyclic voltametry, against a silver chloride electrode. The following half-wave potential $E_{\frac{1}{2}}$ was obtained: $E_{\frac{1}{2}}$=about $-1.3$ V; color change: red→brown.

EXAMPLE 2

1 mole (119 g) of poly-p-aminostyrene was dissolved in 1,000 ml of 1,2-dichloroethane, and the solution was heated to 50° C. 1 mole (368 g) of 9-n-butoxy-1-ethoxyphenalenium tetrafluoborate was dissolved in 1,000 ml of 1,2-dichloroethane, and this solution was added dropwise to the polymer solution in the course of 1 hour, while stirring. The solution was allowed to continue reacting for 10 hours at 80° C., and was then concentrated under reduced pressure to 500 ml. The derivatized polymer was precipitated by the addition of 1,000 ml of n-heptane, separated by filtration and dried under reduced pressure.

Yield of poly-[p-N-(1'-ethoxyphenalenium-9')-aminostyrene]tetrafluoborate: 413 g=100%. Degree of derivatization: about 100%, based on poly-p-aminostyrene. Formula:

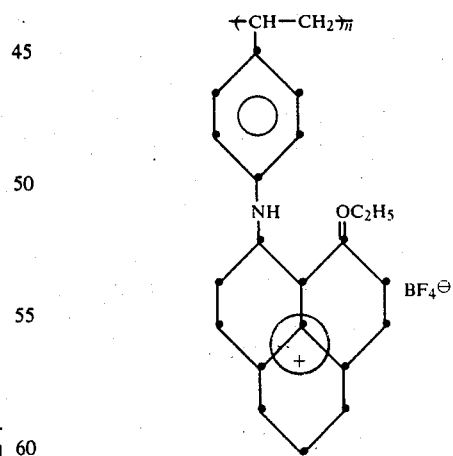

REDOX BEHAVIOR, EXAMPLE 2

A 1–1,000 μm thick film of the novel polymer was applied, as described in Example 1, to a platinum-coated silicon chip which was immersed in an acetonitrile/tri-n-butylammonium perchlorate solution and investigated by cyclic voltametry, a silver chloride eectrode being used as reference. The following half-wave potentials were obtained: $E_{\frac{1}{2}} = -0.3$ V; color change: deep green→brown, $E_{\frac{1}{2}} = -1.4$ V; color change: brown→blue.

EXAMPLE 3

0.2 mole (59.2 g) of poly-[p-N-(9'-phenalen-1'-one)-aminostyrene] was dissolved in 300 ml of perchlorobutadiene, and a solution of 0.2 mole (38 g) of triethyloxonium tetrafluorborate in 200 ml of perchlorobutadiene was added dropwise to the above solution at room temperature, in the course of 1 hour, while stirring. The solution is allowed to continue reacting for 5 hours and is then concentrated to 200 ml, after which the product is precipitated by the addition of n-heptane. The product is purified by reprecipitating it twice with perchlorobutadiene/n-hexane.

Yield of poly-[p-N-(1'-ethoxyphenalenium-9')-aminostyrene]tetrafluorborate (see Example 2 for formula): 82 g=99%. Degree of oxyethylation: about 100%.

REDOX BEHAVIOR, EXAMPLE 3

The redox behavior of the polymer was similar to that of the polymer obtained in Example 2. The following half-wave potentials $E_{\frac{1}{2}}$ were obtained: $E_{\frac{1}{2}} = -0.26$ V; color change: deep green→brown, $E_{\frac{1}{2}} = -1.39$ V; color change: brown→blue.

We claim:

1. A polymer with a molecular weight of 500 to 1,000,000, capable of forming at least two stable, reversibly interconvertible oxidation states with half-wave potentials $E_{\frac{1}{2}}$ of from $-1.5$ to $+1$ V, and contains, as a side group, a 1,9-disubstituted phenalene radical linked to the main polymer chain via the 9-position of the phenylene radical, such polymer being obtained by reacting a vinyl polymer containing reactive groups of the general formula (III), (IV) or (V)

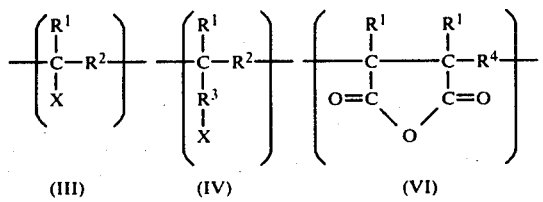

(III)    (IV)    (VI)

where X is OH, SH, NH$_2$, —COOR$^1$, —O—C(O)—R$^5$, COCl or halogen, R$^1$ is H, C$_1$-C$_5$-alkyl or aryl, R$^2$ is C$_1$-C$_5$-alkylene, C$_1$-C$_5$-alkylidene or arylene, R$^3$ is C$_1$-C$_5$-alkylene, C$_1$-C$_5$-alkylidene, 1,4-cycloalkylene or p-arylene, R$^4$ is —[CH(C$_6$H$_5$)—CH$_2$]— and R$^5$ is C$_1$-C$_5$-alkyl, said vinyl polymer containing 5 to 10,000 reactive groups as repeating units, said vinyl polymer having a molecular weight of from 500 to 1,000,000, with a 1,9-disubstituted phenalene of the formula (I) or (II),

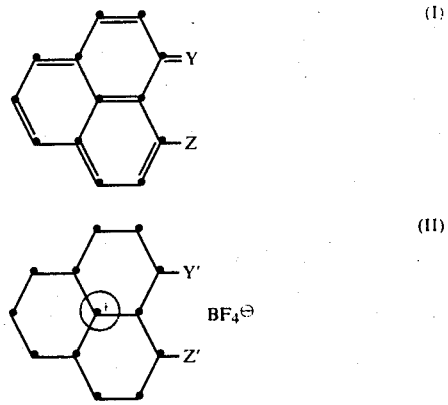

where Y is O, NR, S, Se or Te, Z is OR, SR, NR$_2$, —O—(CH$_2$)$_m$—OR, —NH—(CH$_2$)$_m$—OR, —S—(CH$_2$)$_m$—OR, —NH—(CH$_2$)$_m$—NR$_2$, —O—(CH$_2$)$_m$—NR$_2$, —S—(CH$_2$)$_m$—NR$_2$, —O—(CH$_2$)$_m$—CHO or —N$_2$MeF$_6$ where Me is As or Sb, and Y' is —OR, —SR or —NR$_2$, Z' is —OR, —SR or —NR$_2$, and R is H, C$_1$-C$_5$-alkyl, C$_6$-C$_{12}$-cycloalkyl or C$_7$-C$_{14}$-aralkyl, and, in the group —NR$_2$, the two radicals R may also be cyclically linked to one another, and m is 1-5.

2. A polymer as claimed in claim 1, where Y is O, S or NR, Z is OR, SR, NR$_2$, —O—(CH$_2$)$_m$—OH, —NH—(CH$_2$)$_m$—OH, —NH—(CH$_2$)$_m$—NH$_2$, —O—(CH$_2$)$_m$—NH$_2$ or —O—(CH$_2$)$_m$—CHO, Y' is —OR, or —NR$_2$, and Z' is —OR or —NR$_2$.

3. A polymer as claimed in claim 1, wherein the vinyl polymer reacted with 1,9-disubstituted phenalene contains repeating units of the general formula (III) or (IV) where R$^1$ is H or C$_1$-C$_5$-alkyl, R$^2$ is C$_1$-C$_5$-alkylene or C$_1$-C$_5$-alkylidene, R$^3$ is C$_1$-C$_5$-alkylene, C$_1$-C$_5$-alkylidene, cyclohexylene, p-phenylene or

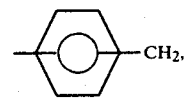

and X has the meanings given in claim 1.

4. A polymer as claimed in claim 1, wherein the vinyl polymer reacted with 1,9-disubstituted phenalene is a copolymer of styrene and maleic anhydride and/or fumaric anhydride or polyvinyl chloride, polyvinyl alcohol, partially hydrolyzed polyvinyl acetate, polyvinyl acetate, polyvinylamine, poly-(1-aminoprop-2-ene), poy-(1-hydroxyprop-2-ene), polymethyl crotonate, polymethyl vinylacetate, polyvinylacetic acid chloride, poly-p-aminostyrene, poly-(p-amino-alpha-methylstyrene), poly-p-chloromethylstyrene, polyacrylic acid, polyethyl acrylate, polyacrylic acid chloride, polymethacrylic acid, polymethyl methacrylate and polyethyl methacrylate.

* * * * *